United States Patent [19]

Golio et al.

[11] Patent Number: 4,849,716
[45] Date of Patent: Jul. 18, 1989

[54] DIRECT OPTICAL INJECTION LOCKING CIRCUITRY UTILIZING OPTICAL OSCILLATOR TUNING

[75] Inventors: John M. Golio; David A. Warren, both of Chandler, Ariz.

[73] Assignee: Motorola, Inc., Schaumburg, Ill.

[21] Appl. No.: 231,922

[22] Filed: Aug. 15, 1988

[51] Int. Cl.[4] .......................... H03B 5/08; H03B 5/18
[52] U.S. Cl. ...................................... 331/66; 331/96; 331/117 FE; 331/117 D; 331/172; 331/177 R; 331/177 V
[58] Field of Search ............. 331/55, 66, 96, 107 OP, 331/117 R, 117 FE, 117 D, 153, 172, 177 R, 177 V

[56] References Cited

U.S. PATENT DOCUMENTS

| | | | |
|---|---|---|---|
| 4,264,875 | 4/1981 | Hunsperger et al. | 331/66 |
| 4,346,394 | 8/1982 | Figueroa et al. | 357/30 |
| 4,360,246 | 11/1982 | Figueroa et al. | 350/96.12 |
| 4,416,053 | 11/1983 | Figueroa et al. | 437/3 |
| 4,503,403 | 3/1985 | Taylor et al. | 331/37 |
| 4,625,182 | 11/1986 | Bovino et al. | 331/66 X |
| 4,635,246 | 1/1987 | Taylor et al. | 370/3 |

Primary Examiner—David Mis
Attorney, Agent, or Firm—Jordan C. Powell

[57] ABSTRACT

An optical injection locking oscillator is comtemplated having a tuning device. The tuning device generates a DC voltage proportional to the resonant frequency of a modulated light used to injection lock the free running oscillator. The DC voltage is applied to a varactor capacitor within the oscillator to bring the frequency of oscillation within a close proximity to the modulating frequency of the light. This facilitates injection locking, whereas frequencies of oscillation outside a certain locking range will not facilitate injection locking. The modulated light then locks the oscillator into a desired resonant frequency. A second embodiment contemplates using a YIG oscillator regulated by a DC current generated within the tuning device.

19 Claims, 1 Drawing Sheet

DIRECT OPTICAL INJECTION LOCKING CIRCUITRY UTILIZING OPTICAL OSCILLATOR TUNING

BACKGROUND OF THE INVENTION

This invention relates, in general, to microwave oscillators, and more specifically, to optical injection locking of microwave oscillators.

Recent developments in microwave oscillators incorporate modulated light sources to stabilize the oscillator frequencies. When the modulated frequency of such light sources approximates the free running oscillator frequency, injection locking occurs and the oscillator produces a clean output signal at the injected modulated light frequency. However, when the free running oscillator frequency is substantially different than the injected modulated light frequency, injection locking does not occur. Previous injection locking schemes have been limited to low tuning ranges. One such scheme reported a 12 MHz locking range for a 10.779 GHz oscillator. "Phase and Frequency Coherency of Multiple Optically Synchronized 20 GHz FET Oscillators for Satellite Communications", *IEEE Microwave Theory and Techn. Symposium Digest*, 1987, pp. 823–826. The scheme used a PIN diode to detect the modulating light signal and electrically lock the oscillator.

SUMMARY OF THE INVENTION

It is, therefore, an object of the present invention to provide a microwave oscillator with an increased injection locking range.

It is another object of the present invention to allow octave tuning ranges within the microwave oscillator.

Still another object of the present invention is to eliminate the need for mechanical tuning of the oscillator.

A further object of the present invention is to injection lock and tune the oscillator using an optical injection locking scheme.

Another object of the present invention is to provide a method of optically injection locking and simultaneously optically tuning a microwave oscillator.

In accordance with the foregoing objects, an optical injection locking microwave oscillator, incorporating a varactor capacitor, is coupled to an optical tuning mechanism. The electric signal from the oscillator has a resonant frequency governed by a modulated light source which is split and concentrated on both the oscillator and the tuning mechanism. The tuning mechanism generates a voltage proportional to the resonant frequency of the modulated light source, and transmits this voltage to the varactor capacitor. By varying the voltage on the capacitor according to the resonant frequency of the light source, the tuning mechanism causes the oscillator to resonate within a frequency very close to the light source resonant frequency. This facilitates optical injection locking of the oscillator by the portion of the light source concentrated on the oscillator.

Other objects and advantages of the present invention will become apparent from the following detailed description, particularly when considered in conjunction with the accompanying drawings.

DETAILED DESCRIPTION OF THE PREFERRED EMBODIMENT

Throughout the specification, the term field effect transistor will be abbreviated "FET".

Figure 1:
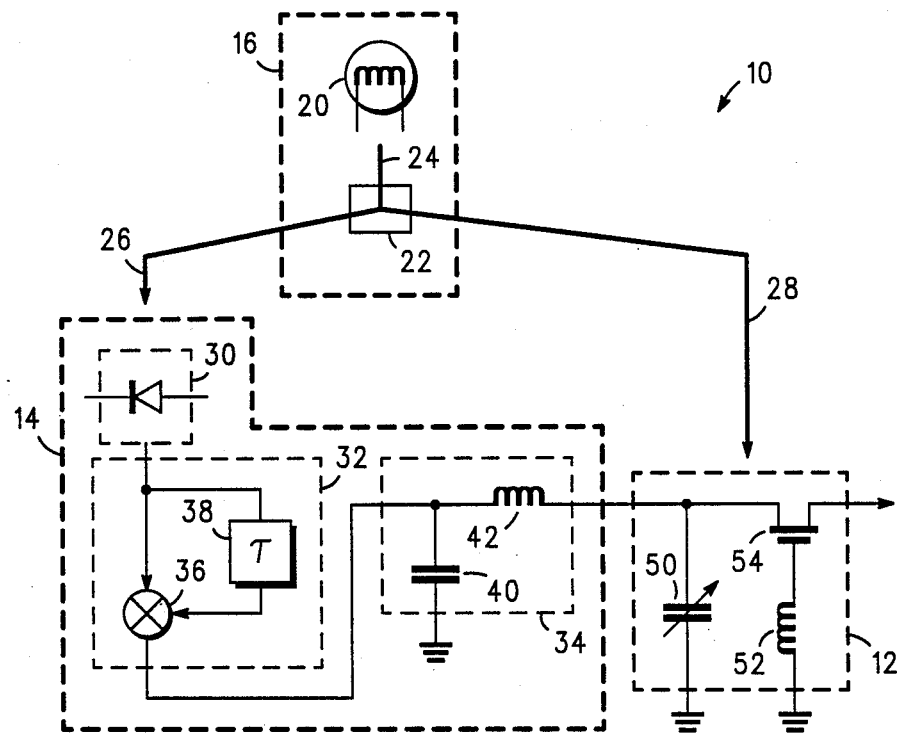
FIG. 1 is a schematic drawing of the optical injection locking oscillator and tuning mechanism.

An optical injection locking microwave oscillator and tuner 10 is shown in FIG. 1. In particular, oscillator and tuner 10 includes tunable oscillator 12, tuning device 14, and modulated light 16.

Modulated light 16 comprises light source 20 which is preferably a laser, and beam splitter 22. Light source 20 directs a beam of light 24 onto beam splitter 22 where light 24 is split into two portions, 26 and 28. Light 26 is then directed and concentrated on tuning device 14, whereas light 28 is directed and concentrated on tunable oscillator 12. Beam of light 24 is modulated at a desired resonant frequency, and hence, lights 26 and 28 also are modulated at the desired resonant frequency.

Tuning device 14 comprises detector 30, frequency discriminator 32, and filter 34. Light 26 is concentrated on detector 30, which is preferably a PIN or photodiode. Detector 30 receives modulated light 26 and emits an electric modulated signal at the same resonant frequency. Detector 30 is coupled to frequency discriminator 32 which is comprised of mixer 36 and time delay 38. When the electric signal from detector 30 is emitted, it splits into two portions within frequency discriminator 32. A first portion is sent directly to mixer 36. A second portion is sent to time delay 38 where it is shifted in time. This time delayed second portion is then relayed to mixer 36 and recombined with the first portion to approximate a DC voltage. The magnitude of the DC voltage is directly proportional to the resonant frequency of light 26. For instance, when the resonant frequency is high, the resultant voltage from mixer 36 approximates a high DC voltage. Conversely, when the resonant frequency is low, the resultant voltage from mixer 36 approximates a low DC voltage. This DC voltage is then passed through filter 34 to filter AC signals from the approximated DC voltage. Filter 34 is also used to change a proportionality constant of tuning device 14. The DC voltage is then relayed to tunable oscillator 12.

The operation of tunable oscillator 12 may be understood from the generic oscillator block diagram in FIG. 1 having a varactor capacitor 50, inductor 52, and FET 54. Varactor capacitor 50 can be varied electronically. Varactor capacitor 50 and inductor 52 illustrate a free running oscillator. Without optical injection locking, tunable oscillator 12 produces electrical oscillations at some free running frequency fo. If the free running oscillator has a frequency of oscillation which is too far away from the frequency of light 24, optical injection locking cannot occur. For instance, a difference of 10 to 20 MHz for a 2 GHz oscillator (or 0.01 octaves) has been found to be too far away. To bring tunable oscillator within close enough range to optically injection lock the free running oscillator, light 26 is directed on detector 30, tuning device 14 to produce the DC voltage which is then relayed through filter 34 to varactor capacitor 50. By imposing the DC voltage on varactor capacitor 50, the frequency of oscillation of tunable oscillator 12 is shifted to a frequency f1 which approximates (within 0.01 octaves) to the modulated light frequency of light 24. Light 28 is then concentrated on FET 54 causing the oscillation frequency of tunable oscillator 12 to shift to the exact frequency of light 24.

Figure 2:
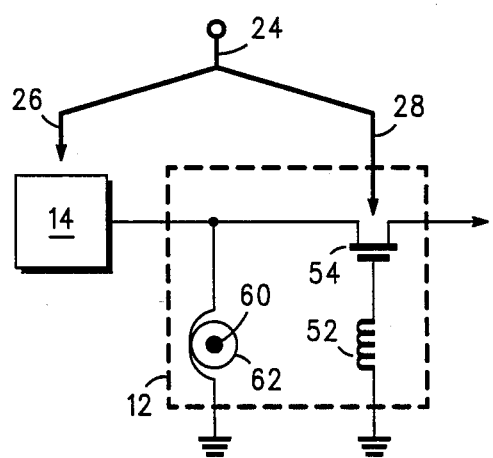
FIG. 2 is a second embodiment of the optical injection locking oscillator.
Figure 3:
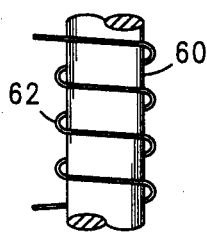
FIG. 3 shows an element of the second embodiment in more detail.

FIG. 2 shows an alternate embodiment of tunable oscillator 12. In this embodiment, a Yttrium Iron Garnet (YIG) crystal 60 wrapped in a wire coil 62, as shown in FIG. 3, replaces varactor capacitor 50. Frequency discriminator 32 is altered such that tuning device 14 outputs a DC current proportional to the resonant frequency of light 24 rather than a DC voltage. As the DC current passes through wire coil 62, a magnetic field is created. This magnetic field encompasses YIG crystal 60 and operates to tune the resonant frequency of YIG crystal 60 proportionally to the magnetic field. The resonant frequency of YIG crystal 60 controls the oscillating frequency of tunable oscillator 12 and tuning the oscillating frequency to within a close range of the resonant frequency of light 24. Light 28 then injection locks the oscillating frequency to the resonant frequency of light 24 within transistor 54.

Thus it is apparent that there has been provided, in accordance with the invention, an optical injection locking oscillator and tuning device that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:
1. An optical injection locking device comprising:
light means for supplying a modulated beam of light at a resonant frequency;
tunable oscillator means for receiving a first portion of said modulated beam of light, for supplying an oscillating electric signal, and for locking said oscillating electric signal at said resonating frequency of said modulated beam of light;
tuning means for receiving a second portion of said modulated beam of light and for tuning said tunable oscillator means to within an approximate range of said resonant frequency;
said tuning means coupled to said tunable oscillator means; and
said light means optically coupled to said tunable oscillator means and to said tuning means.

2. An optical injection locking device according to claim 1 wherein said tuning means comprises:
detector means for receiving said second portion of said modulated beam of light, and for converting said beam of light into a resonating electric signal;
said detector means having an optical input to receive said second portion and having an output;
frequency discriminator means for receiving said resonating electric signal from said detector means and for converting said resonating electric signal into a DC signal;
said frequency discriminator means having an input coupled to said output of said detector means, and an output;
filter means for receiving said DC signal from said frequency discriminator means, for filtering AC signals received from said frequency discriminator means, and for relaying said DC signal to said tunable oscillator means; and
said filter means having an input coupled to said output of said frequency discriminator means and an output.

3. An optical injection locking device according to claim 2 wherein said tunable oscillator means comprises:
oscillator means for creating an oscillating electric signal;
transistor means for receiving and relaying said oscillating electric signal, for receiving said first portion of said modulated beam of light, and for locking said oscillating electric signal to said resonant frequency of said modulated beam of light; and
said oscillator means coupled to said filter means to receive said DC signal, and coupled to said transistor means.

4. An optical injection locking device according to claim 2 wherein said frequency discriminator means comprises:
mixer means having a first input coupled to said output of said detector means, a second input, and an output coupled to said filter means;
time delay means having an input coupled to said output of said detector means, and an output coupled to said second input of said mixer means;
said time delay means for receiving a portion of said resonating electric signal from said detector means and for delaying said resonating electric signal; and
said mixer means for receiving a second portion of said resonating electric signal, for receiving said first portion of said resonating electric signal from said time delay means, and for mixing said first and second portions of said resonating electric signal to produce said DC voltage.

5. An optical injection locking device according to claim 2 wherein said detector means comprises a photodiode.

6. An optical injection locking device according to claim 2 wherein said filter means comprises a low-pass filter having a capacitor means for creating a capacitance and for shorting AC signals to an electric ground, and said low-pass filter further having an inductor means for allowing said DC voltage to pass to said tunable oscillator means.

7. An optical injection locking device according to claim 1 wherein said light means comprises a light splitter means for splitting said resonating beam of light into said first portion and said second portion.

8. An optical injection locking device according to claim 3 wherein said DC signal is a DC voltage.

9. An optical injection locking device according to claim 8 wherein said tunable oscillator means further comprises:
said transistor means including a first port and a second port;
varactor means coupled to said filter means and to said first port of said transistor means;
inductor means coupled to said second port of said transistor means;
said varactor means and said inductor means for creating said oscillating electric signal; and
said varactor means for receiving said DC voltage from said filter means.

10. An optical injection locking device according to claim 9 wherein said varactor means is a variable capacitor.

11. An optical injection locking device according to claim 3 wherein said DC signal is a DC current.

12. An optical injection locking device according to claim 11 wherein said tunable oscillator means further comprises:
   said YIG resonating means coupled to said filter means and to said first port of said transistor means;
   inductor means coupled to said second port of said transistor means;
   said YIG resonating means and said inductor means for creating said oscillating electric signal; and
   said YIG resonating means for receiving said DC current from said filter means.

13. An optical injection locking device according to claim 12 wherein said YIG resonating means comprises Yttrium Iron Garnet crystals wrapped in a wire coil.

14. An optical injection locking device according to claim 1 wherein said light means further comprises:
   splitter means for splitting said modulated beam of light into said first portion and said second portion; and
   said splitter means optically coupled to said light means, to said tunable oscillator, and to said tuning means.

15. An optical injection locking device according to claim 3 wherein said transistor means further comprises an output for outputting said locked oscillating electric signal.

16. A method for optically tuning and injection locking an oscillator comprising the steps of:
   concentrating a first portion of a modulated beam of concentrated light at a given resonant frequency on a tunable oscillator and a second portion of said modulated beam of concentrated light on a tuning means for tuning said tunable oscillator;
   creating a DC signal within said tuning means, said DC signal proportional to said resonant frequency, and relaying said DC signal to said tunable oscillator;
   creating a regulated oscillation close in frequency to said resonant frequency by regulating a free running oscillator within said tunable oscillator using said DC signal; and
   injection locking said regulated oscillation to said resonant frequency with said first portion of said modulated beam of concentrated light.

17. A method for optically tuning an oscillator according to claim 16 wherein said step of regulating a free running oscillation comprises applying said DC to a varactor capacitor within said tunable oscillator.

18. A method for optically tuning an oscillator according to claim 16 wherein said step of regulating a free running oscillation comprises applying said DC signal to a Yttrium Iron Garnet crystal in a wire coil within said tunable oscillator.

19. A method for optically tuning an oscillator according to claim 16 wherein said step of injection locking said regulated oscillation comprises concentrating said first portion of said modulated beam on a field effect transistor coupled to said regulated free running oscillator.

* * * * *

UNITED STATES PATENT AND TRADEMARK OFFICE
CERTIFICATE OF CORRECTION

PATENT NO. : 4,849,716

DATED : July 18, 1989

INVENTOR(S) : John M. Golio and David A. Warren

It is certified that error appears in the above-identified patent and that said Letters Patent is hereby corrected as shown below:

In column 5, claim 12, line 4, after the word "said" insert --transistor means including a first port and a second port;--

In column 5, claim 12, line 4, begin a new paragraph with the word "YIG".

Signed and Sealed this

Twenty-fourth Day of July, 1990

Attest:

HARRY F. MANBECK, JR.

*Attesting Officer*

*Commissioner of Patents and Trademarks*